(12) United States Patent
Kojima

(10) Patent No.: US 7,423,491 B2
(45) Date of Patent: Sep. 9, 2008

(54) SEMICONDUCTOR AMPLIFIER

(75) Inventor: Haruo Kojima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/742,263

(22) Filed: Apr. 30, 2007

(65) Prior Publication Data

US 2007/0252650 A1 Nov. 1, 2007

Related U.S. Application Data

(63) Continuation of application No. 11/148,168, filed on Jun. 9, 2005, now Pat. No. 7,262,668.

(30) Foreign Application Priority Data

Jun. 10, 2004 (JP) ............................. 2004-172186

(51) Int. Cl.
*H03F 1/52* (2006.01)
(52) U.S. Cl. ..................................................... 330/298
(58) Field of Classification Search ................ 330/298, 330/207 P, 117; 455/117
See application file for complete search history.

(56) References Cited

U.S. PATENT DOCUMENTS 4,427,951 A 1/1984 Amada et al.
5,357,089 A 10/1994 Prentice
2005/0140452 A1 6/2005 Nagata

FOREIGN PATENT DOCUMENTS

| EP | 0 926 815 A1 | 6/1999 |
|---|---|---|
| JP | 57-3405 | 1/1982 |
| JP | 2004-186735 | 7/2004 |

*Primary Examiner*—Robert Pascal
*Assistant Examiner*—Hieu P Nguyen
(74) *Attorney, Agent, or Firm*—Oblon, Spivak, McClelland, Maier & Neustadt, P.C.

(57) ABSTRACT

A first power source 11 for supplying a bias voltage to a gate electrode G of a field effect transistor 13, which amplifies high-frequency signals, and a second power source 15 for supplying a bias voltage to a drain electrode D of the field effect transistor 13 are provided. The protective resistance 12 is connected between the gate electrode G of the field effect transistor 13 and the first power source 11, and the bias voltage controller 14 is connected between the drain electrode D of the field effect transistor 13 and the second power source 11. Further, a voltage detector 16 is connected between both ends of the protective resistance 12 to detect a voltage drop generated between both ends of the protective resistance 12, when a rectified current flows to the gate electrode G from the drain electrode D of the field effect transistor 13.

8 Claims, 1 Drawing Sheet

SEMICONDUCTOR AMPLIFIER

CROSS-REFERENCE TO RELATED APPLICATIONS

This application is a continuation application of U.S. Ser. No. 11/148,168, filed Jun. 9, 2005, which issued as U.S. Pat. No. 7,262,668, and claims the benefit of priority from prior Japanese Patent Application No. 2004-172186, filed Jun. 10, 2004, the entire contents of which are incorporated herein by reference.

BACKGROUND OF THE INVENTION

Field of the Invention

The present invention relates to a semiconductor amplifier using a semiconductor amplifying element.

In a semiconductor amplifier for amplifying a high-frequency signal such as microwave, a field effect transistor (hereinafter, called as an FET) is used as an amplifying element. In a semiconductor amplifier using an FET, a rectified current flows between a drain electrode and a gate electrode of the FET in the reverse direction so that the gate electrode may be damaged when a large high-frequency signal is input. Therefore, in a conventional semiconductor amplifier, a protective circuit is provided to suppress the rectified current flowing between a drain electrode and a gate electrode of the FET in the reverse direction.

Here, a conventional semiconductor amplifier provided with a protective circuit will be explained referring to a circuit diagram shown in FIG. 1 using a Schottky junction FET for example. A variable voltage power source 21 has a positive side terminal 21a and a negative side terminal 21b, wherein the positive side terminal 21a is grounded. The negative side terminal 21b is connected to a minus (−) end 22a of a protective resistance 22. The other end 22b of the protective resistance 22 is connected to a gate electrode G of FET 23. The FET 23 has the gate electrode G, a drain electrode D and a source electrode S, wherein the source electrode S is grounded. The drain electrode D is connected to the positive side terminal 24a of the constant voltage power source 24 and the negative side terminal 24b of the constant voltage power source is grounded.

Further, an input terminal IN is connected to the gate electrode G and an output terminal OUT is connected to the drain electrode D.

In the circuit described above, a high-frequency signal is input through the input terminal IN and is amplified by FET 23. The high-frequency signal amplified is output to the output terminal OUT.

Further, a semiconductor amplifying circuit provided with a protective circuit to protect an amplifying element from being damaged by the rectified current between the drain electrode and the gate electrode is also disclosed in the Japanese Patent Application Disclosure No. H8-222967.

In the conventional semiconductor amplifying circuit, a large negative voltage is applied to the gate electrode G, in which a negative voltage supplied from a variable voltage power source and a negative peak voltage of input signal are superposed with each other, when a large high-frequency signal is input. At this time, the drain-to-gate electrode voltage of FET 23 becomes large and the rectified current flows between the drain electrode D and the gate electrode G in the reverse direction as shown by the arrow Y. At this time, the gate electrode of FET 23 may be damaged by the rectified current and the reliability of the semiconductor amplifying circuit is lowered.

However, in the case of the circuit configuration shown in FIG. 1, the voltage drop is generated between both terminals of the protective resistance 22 when the rectified current flows, since the protective resistance 22 is connected to the gate electrode G of FET 23 As a result, voltage applied to the gate electrode G of FET 23 increases and the gate-to-source electrode voltage becomes small by approaching 0V. Thus, the damage of the amplified element is prevented.

However, when an FET for large power is used as an amplifying element, the voltage drop is generated between both terminals of the protective resistance 22 and the drain-to-source electrode current increases when the gate-to-source electrode voltage becomes close to 0V. Therefore, FET 23 is thermally damaged due to an increase of the power consumption of FET 23 and the reliability of the semiconductor amplifying circuit drops.

It is one of the objects of the present invention to provide a semiconductor amplifying circuit that is capable of preventing an amplifying element from being damaged and to improve the reliability of the circuit.

SUMMARY OF THE INVENTION

A semiconductor amplifying circuit according to an embodiment of the present invention includes a semiconductor amplifying element having a first electrode, a second electrode and a third electrode for amplifying a high-frequency signal that is input to the first electrode and is output to the third electrode, a first power source to supply a bias voltage to the first electrode of the semiconductor amplifying element, a second power source to supply a bias voltage to the second electrode of the semiconductor amplifying element, a protective resistance connected between the first electrode of the semiconductor amplifying element and the first power source, a voltage detector for detecting a voltage generated between both terminals of the protective resistance, and a bias voltage controller connected between the second electrode of the semiconductor amplifying element and the second power source for controlling the bias voltage supplied to the second electrode of the semiconductor amplifying element based on an output signal of the voltage detector.

Further, a semiconductor amplifying circuit according to the embodiment of the present invention includes a field effect transistor equipped with a gate electrode, a drain electrode and a source electrode, a first power source for supplying a bias voltage to the gate electrode of the field effect transistor, a second power source for supplying a bias voltage to the drain electrode of the field effect transistor, a protective resistance connected between the gate electrode of the field effect transistor and the first power source, an NPN transistor connected between the drain electrode of the field effect transistor and the second power source, a first differential amplifying circuit to detect a voltage generated between both ends of the protective resistance, and a second differential amplifying circuit for applying a control voltage generated based on an output signal of the first differential amplifying circuit to a base electrode of the NPN transistor.

In the semiconductor amplifying circuit described above, the rectified current flowing in the reverse direction between the electrodes of the amplifying element is suppressed by a protective resistance. Further, when rectified current flowing in the reverse direction is generated, voltage generated between both ends of the protective resistance is detected and the bias voltage supplied to the amplifying element is lowered by a bias voltage controller. Accordingly, the thermal damage is prevented from being generated on the amplifying element and the reliability of the element is improved.

DETAILED DESCRIPTION OF THE INVENTION

Figure 1:
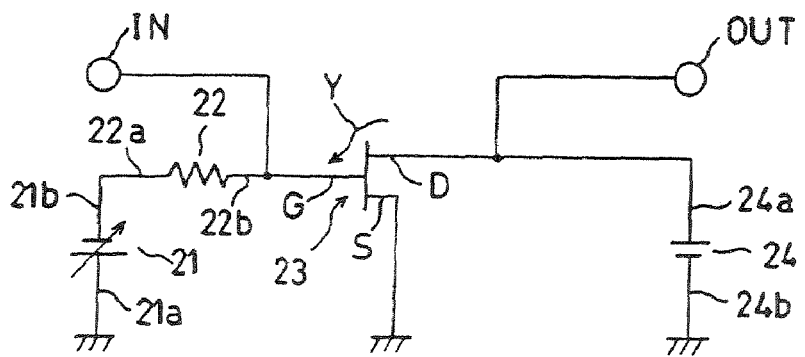
FIG. 1 is a circuit diagram showing an example of a conventional semiconductor amplifying circuit.
Figure 2:
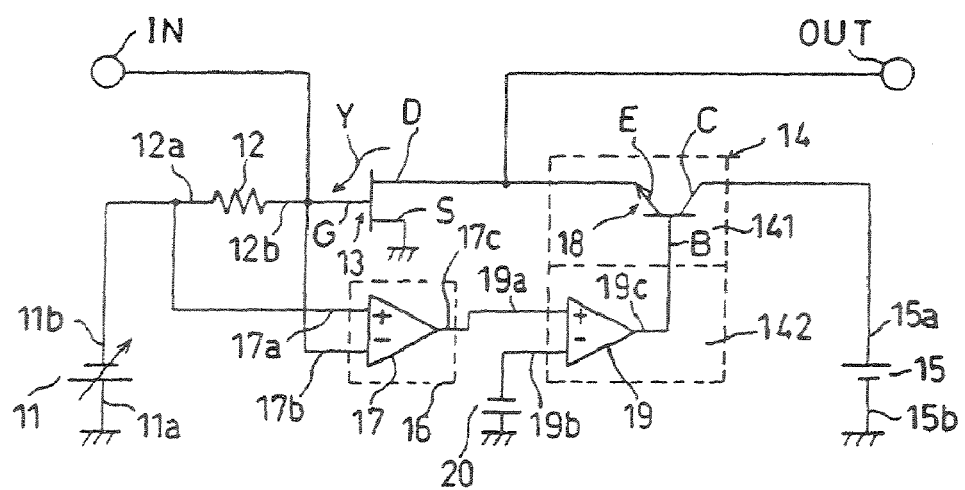
FIG. 2 is a circuit diagram showing a semiconductor amplifying circuit according to an embodiment of the present invention.

An embodiment of the present invention will be explained below referring to a circuit diagram shown in FIG. 2. A first power source, which is, for example, a variable voltage power source 11 has a positive side terminal 11a and a negative side terminal 11b, wherein the positive side terminal 11a is grounded and the negative side terminal 11b is connected to one end 12a of a protective resistance 12. The other end 12b of the protective resistance 12 is connected to a gate electrode G. The FET 13 has the gate electrode G, a drain electrode D and a source electrode S, wherein the source electrode S is grounded. The drain electrode D is connected to a positive side terminal 15a of a constant voltage power source 15, which is a second power source, through a bias voltage controller 14. A negative side terminal 15b of the constant voltage power source 15 is grounded.

Further, a voltage detector 16 is connected to both ends of the protective resistance 12. The voltage detector 16 is composed of a differential amplifier 17 having a plus input terminal 17a connected to one end 12a of the protective resistance 12, which is on the side of the variable voltage power source 11. A minus input terminal 17b of the differential amplifier 17 is connected to the other side 12b of the protective resistance 12, which is on the side of the gate electrode G. An output terminal 17c of the differential amplifier 17 is connected to the bias voltage controller 14.

The bias voltage controller 14 is composed of a voltage set-up circuit 141 and a level shift circuit 142.

The voltage set-up circuit 141 is composed of an NPN transistor 18. The transistor 18 has an emitter electrode E, a collector electrode C and a base electrode B. The emitter electrode E is connected to the drain electrode D of the FET 13 and the collector electrode C is connected to the positive side terminal 15a of the constant voltage power source 15.

The level shift circuit 142 is composed of a differential amplifier 19. The differential amplifier 19 has a plus input terminal 19a and a minus input terminal 19b, wherein the plus input terminal 19a is connected to an output terminal 17c of the differential amplifier 17. The minus input terminal 19b is connected to a negative power source 20, which provides minus input terminal 19b with a negative voltage. The output terminal 19c of the differential amplifier 19 is connected to the base electrode B of the transistor 18, that is a control terminal of the voltage set-up circuit 141.

Further, an input terminal IN is connected to the gate electrode G of the FET 13 and an output terminal OUT is connected to the drain electrode D of the FET 13.

Here, the operations of the semiconductor amplifier described above will be explained.

When a high-frequency signal input through the input terminal IN is small, the drain-to-gate electrode voltage of the FET 13 is small and the rectified current does not flow between the drain electrode D and the gate electrode G. In this case, the voltage drop by the rectified current is not generated between both terminals of the protective resistance 12. Thus, the output of the voltage detector 16, that is the output at the output terminal 17c of the differential amplifier 17 becomes 0. The output is applied to the plus input terminal 19a of the differential amplifier 19 of the level shift circuit 142.

Negative voltage is applied to the minus input terminal 19b of the differential amplifier 19. Accordingly, a positive voltage, for example, is output to the output terminal 19c, which is an output voltage of the detector 16 being shifted by a specified level. The positive voltage is applied to the base electrode of the transistor 18 that is a control terminal of the voltage set-up circuit 141 and the transistor 18 is placed in the operating state. Then, a positive bias voltage is supplied to the drain electrode D of the FET 13 from the constant voltage power source 15.

The high-frequency signal, which is input through the input terminal IN under this state, is amplified by the FET 13 and output to the output terminal OUT.

On the other hand, when a high-frequency signal input through the input terminal IN becomes large, the negative voltage supplied from the variable voltage power source 11 and negative peak voltage of the input signal are superposed with each other and the drain-to-gate voltage of the FET 13 becomes large. At this time, the rectified current flows in the reverse direction as shown by an arrow mark Y.

When the rectified current flows, the voltage drop is generated between both ends of the protective resistance 12 and the gate-to-source electrode voltage of the FET 13 becomes small, by decreasing close to 0V, for example. Therefore, the rectified current becomes small and the damage of the gate electrode of the FET 13 is prevented from being caused. However, in a case, for example, where an FET for large electric power is used as an amplifying element, the drain-to-source electrode current of the FET 13 increases when the gate-to-source electrode voltage becomes close to 0V.

In the circuit structure described above, however, the voltage drop is generated between both ends of the protective resistance 12, when the rectified current flows, and this voltage drop between both ends is detected by the voltage detector 16. At this time, the voltage at the other end 12b of the protective resistance 12 becomes higher than the voltage at the end 12a and the output of the differential amplifier 17 drops. Accordingly, the output of the differential amplifier 19 becomes small and the control voltage applied to the base electrode B of the transistor 18 that is the control terminal of the voltage set-up circuit 141 drops. As a result, the voltage of the emitter electrode E of the transistor 18, that is a bias voltage supplied to the drain electrode D of the FET 13, drops and the current flowing between the drain and source electrodes decreases. With the operations, the power consumption of the FET 13 is suppressed and the thermal damage of the FET 13 is prevented from being caused.

According to the circuit configuration described above, the increase in the rectified current between the drain and gate electrodes is prevented from flowing by a protective resistance connected to the gate electrode of the FET. Further, the increase in the drain-to-source electrode current that becomes a problem when a protective resistance is connected is suppressed by the operations of the voltage detector and the bias voltage controller thereby the thermal damage of the semiconductor element being prevented.

Further, in the embodiment mentioned above, the bias voltage controller is composed of the NPN transistor 18. In this case, when the control signal applied to the base electrode B of the transistor 18 becomes small, the resistance between the emitter electrode E and the collector electrode C of the transistor 18 substantially increases. Therefore, the current flowing into the drain electrode D of the FET 13 decreases and the drain-to-source current becomes small.

The present invention is not restricted to the embodiment described above but can be modified variously as described below.

For example, a semiconductor amplifier using a field effect transistor is explained as a semiconductor element in the above. However, this invention is also applicable to a semiconductor amplifier using a bipolar transistor as an amplifying element.

Further, the negative bias voltage is applied to the gate of the field effect transistor. However, this invention is also applicable to operate the amplifier by applying positive bias voltage to the gate.

The invention claimed is:

1. A semiconductor amplifier comprising:
   a semiconductor amplifying element, having a first electrode, a second electrode, and a third electrode, configured to amplify a high-frequency signal that is input to the first electrode and to output an amplified signal to the second electrode;
   a first power source configured to supply a first bias voltage to the first electrode of the semiconductor amplifying element;
   a second power source configured to supply a second bias voltage to the second electrode of the semiconductor amplifying element;
   a third power source configured to supply a negative voltage;
   a protective resistance connected between the first electrode of the semiconductor amplifying element and the first power source;
   a voltage detector for detecting a voltage generated between two terminals of the protective resistance;
   a differential amplifier having a first input terminal connected to the voltage detector and a second input terminal connected to the third power supply, the differential amplifier being configured to output a control voltage based on the negative voltage supplied from the third power supply and an output signal of the voltage detector; and
   a bias voltage controller, connected between the second electrode of the semiconductor amplifying element and the second power source, configured to control the second power source bias voltage to be supplied to the second electrode of the semiconductor amplifying element based on the control voltage output from the differential amplifier.

2. The semiconductor amplifier according to claim 1, wherein the semiconductor amplifying element includes a field effect transistor.

3. The semiconductor amplifier according to claim 2, wherein the field effect transistor is a Schottky junction field effect transistor.

4. The semiconductor amplifier according to claim 1, wherein the bias voltage controller includes a bipolar transistor.

5. The semiconductor amplifier according to claim 4, wherein the bipolar transistor is composed of an NPN transistor.

6. The semiconductor amplifier according to claim 1, wherein the voltage detector includes a differential amplifier, a minus input terminal of which being connected to the protective resistance on a semiconductor amplifying element side and a plus input terminal of which being connected to the protective resistance on a first power source side.

7. The semiconductor amplifier according to claim 1, further comprising:
   an input terminal connected to the first electrode of the semiconductor amplifying element, wherein the high-frequency signal is input from the input terminal to the first electrode of the semiconductor amplifying element; and
   an output terminal connected to the second electrode of the semiconductor amplifying element, wherein the amplified signal output to the second electrode of the semiconductor amplifying element is output from the output terminal.

8. The semiconductor amplifier according to claim 1, wherein the first power source is a variable voltage power source.

* * * * *